United States Patent [19]

Spooner et al.

[11] Patent Number: 4,467,521

[45] Date of Patent: Aug. 28, 1984

[54] SELECTIVE EPITAXIAL GROWTH OF GALLIUM ARSENIDE WITH SELECTIVE ORIENTATION

[75] Inventors: Frank H. Spooner, Concord; Charles R. Snider, Southboro; John L. Heaton, Bedford, all of Mass.

[73] Assignee: Sperry Corporation, New York, N.Y.

[21] Appl. No.: 523,506

[22] Filed: Aug. 15, 1983

[51] Int. Cl.³ ............... H01L 21/20; H01L 21/302; H01L 21/76

[52] U.S. Cl. ............... 29/576 E; 29/576 W; 29/578; 29/580; 29/591; 148/175; 156/612; 156/647; 156/648; 156/653; 156/657; 156/659.1; 427/84; 357/15; 357/49; 357/50; 357/56

[58] Field of Search ............ 29/576 E, 576 W, 578, 29/580, 591; 148/175; 156/612, 648, 653, 657, 659.1, 647; 427/84; 357/15, 15 P, 49, 50, 56

[56] References Cited

U.S. PATENT DOCUMENTS

| | | | |
|---|---|---|---|
| 3,403,439 | 10/1968 | Bailey | 29/578 |
| 3,425,879 | 2/1969 | Shaw et al. | 148/175 |
| 3,578,515 | 5/1971 | Borrello et al. | 148/175 |
| 3,808,470 | 4/1974 | Kniepkamp | 357/15 X |
| 4,316,201 | 2/1982 | Christou et al. | 357/15 |

OTHER PUBLICATIONS

Shaw, D. W., "Selective Epitaxial Deposition of Gallium Arsenide in Holes", J. Electrochem. Soc., vol. 113, No. 9, Sep. 1966, pp. 904–908.

Yang et al., "Selective Epitaxial Growth of GaAs by Liquid Phase Epitaxy", J. Electrochem. Soc., vol. 129, No. 1, Jan. 1982, pp. 194–197.

Broadie et al., "Selective Planar GaP/Si Deposition . . . Diodes", IBM Tech. Discl. Bull., vol. 16, No. 4, Sep. 1973, p. 1301.

French, W. B., "Technique for Reducing Surface Leakage . . . Devices", RCA Tech. Note No. 919, (2 pages), Oct. 25, 1972.

Primary Examiner—William G. Saba
Attorney, Agent, or Firm—Howard P. Terry; Martin G. Anderson

[57] ABSTRACT

A method of fabricating semiconductor devices on semi-insulating GaAs substrates is provided. Pre-etched holes in the substrate are covered with a dielectric which is etched to expose the substrate only at the bottom of the holes. Epitaxial growth of active GaAs in the holes may then proceed with a single crystallographic orientation. The dielectric covering the sidewalls of the holes prevents unwanted random growth and poor surface morphology of the active area.

15 Claims, 2 Drawing Figures

SELECTIVE EPITAXIAL GROWTH OF GALLIUM ARSENIDE WITH SELECTIVE ORIENTATION

BACKGROUND OF THE INVENTION

1. Field of the Invention

The subject invention pertains to the field of gallium arsenide semi-conductors and, more particularly, to a method of fabricating gallium arsenide (GaAs) devices using vapor phase epitaxial deposition with selective orientation.

2. Description of the Prior Art

As semiconductor and communications technology moved into the millimeter wave region, there has developed a need for semiconductor devices that are compatible with monolithic integrated circuits. That is, integrated circuits where at least one element thereof is formed upon or within a semi-insulating substrate. High performance mixer diodes, for example, require a heavily doped layer several microns thick beneath the active layer to reduce series resistance and to provide a corresponding high cutoff frequency. Fabrication of such devices in monolithic form have heretofore been difficult to achieve. Previous methods of providing device isolation through the heavily doped region have included: mesa etching, which leaves the surface non-planar; proton bombardment in which the thickness of the heavily doped layer is limited by the accelerating voltage of the implanter; and selective epitaxial deposition which offers the advantage of high carrier mobility and low dislocation density but often results in poor surface morphology and edge overgrowth. Irregular surface morphology and non-uniform vapor phase epitaxial growth of active regions has been a continuing problem that may interfere with further processing steps and hinder device performance. See Shaw, "Selective Epitaxial Deposition of Gallium Arsenide in Holes", J. Electro-Chemical Soc. pp. 904–907, September 1966, and Yang, et al, "Selective Epitaxial Growth of GaAs by Liquid Phase Electroepitaxy, J. Electrochemical Soc., pp 194–197, January 1982. The non-uniform growth rate of active GaAs regions, as it is grown in the prepared holes, is a result of more than one growth plane being exposed on the sidewalls and bottom of the etched holes in which the vapor phase epitaxial growth is to take place.

The present invention provides a method for inhibiting unwanted vapor phase epitaxial growth on the sidewalls of the holes in which the active regions are grown by covering the sidewalls with a dielectric prior to vapor phase epitaxial deposition of the active area.

SUMMARY OF THE INVENTION

A method of fabricating semiconductor devices on GaAs semi-insulating substrates which comprises selective epitaxial deposition of a heavily doped GaAs layer in pre-etched holes in the GaAs substrate. The substrate having been covered by a dielectric and then etched to expose a single crystallographic orientation in the bottom of the holes. Uneven growth and poor surface morphology of the epitaxially grown active GaAs region is thus avoided since growth proceeds only from the bottom of the holes. To complete the fabrication of a mixer diode, an n-type layer is deposited on the heavily doped epitaxially grown GaAs region. A shallow etch through the n-type layer defines the active cathode area. This is followed by a deposition, liftoff, and alloy for ohmic contact formation. The anode region is patterned by a lift-off of Schottky metal on the n-type layer.

DESCRIPTION OF THE PREFERRED EMBODIMENT

A method of semiconductor device fabrication using selective epitaxial deposition, suitable for use with the present invention, is described in U.S. Application Ser. No. 338,204, by A. Swanson, et al, "Selective Epitaxial Etch Planar Processing for Gallium Arsenide Semiconductors", filed on Jan. 11, 1982, assigned to the assignee of the present invention and is incorporated herein by reference.

Figure 1:
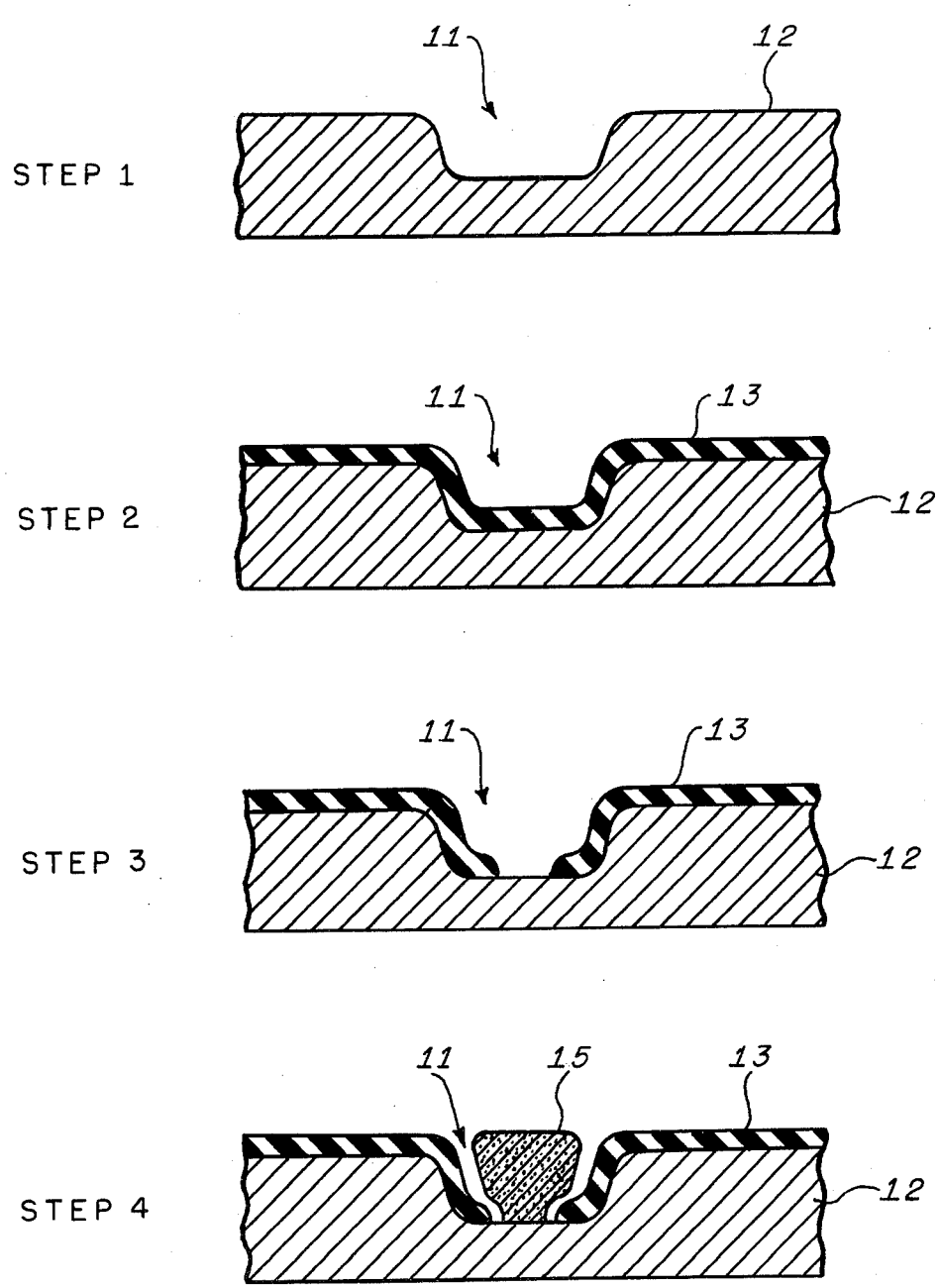
FIG. 1 shows the protection of sidewalls with a dielectric and the subsequent growth of GaAs with a single orientation.

Referring now to FIG. 1, Step 1, a hole 11 may be etched or ion-milled into the substrate 12 to a depth of 4 to 7 microns using techniques to be described in more detail subsequently. In Step 2, a high temperature dielectric 13 which may be, for example, silicon nitride or silicon dioxide is deposited over the prepared substate by a chemical vapor deposition (CVD) process known in the art. In Step 3, dielectric 13 is etched at the bottom of hole 11 exposing the GaAs substrate 12. Etching of the dielectric 13 at the bottom of hole 11 may be accomplished by first applying a layer of photoresist which is then printed and developed exposing an area of the dielectric 13 in the bottom of hole 11. The exposed dielectric 13 may then be etched exposing the substrate 12 at the bottom of hole 11. In Step 4, active GaAs material 15 is grown in the hole using vapor phase epitaxial techniques. Since the exposed GaAs substrate 12 at the bottom of hole 11 has only one crystallographic orientation, epitaxial growth will be uniform with a smooth surface morphology. The dielectric 13 may be left in place for surface passivation or may be removed, if desired, prior to further processing steps.

The fabrication of a mixer diode shown in FIG. 2 utilizing selective epitaxial deposition with selective orientation will now be described.

All photolithography may preferably be accomplished by a 4:1 projection printing. The thin films of the contact metals permit deposition by evaporation and patterning by lift-off. The metallization and lift-off processes are well known in the art and include the application of a layer of photoresist which is then printed and developed to expose selective regions and to provide a stencil-type mask for metallization. Metallization follows techniques known in the art, such as for example, evaporation, which is then followed by the dissolution of the remaining photoresist which will lift off with it any adhering metallization. The resulting surface is then ready for additional processing steps. Device fabrication begins with the printing and wet chemical etching of a master registration level on the preferred GaAs substrate. Other compounds selected from the Group III-V elements of the Periodic Table which have a crystallographic structure similar to gallium arsenide may also be used, such as, indium antimonide, indium phosphide, gallium aluminum arsenide, gallium indium aluminum arsenide, indium arsenide, gallium phosphide, and gallium aluminum indium phosphide. The registration marks allow the 4:1 projection mask aligner to refocus on the surface prior to each exposure. Master registration marks may be chemically etched into the substrate as follows. A photoresist, such as, AZ1450B is spun onto the wafer at 3000 rpm for 30 seconds and then baked at 90° C. for 30 minutes. The master registration mask is exposed and the photoresist developed for 30 seconds in AZ developer diluted with water 1:1. The wafer is cleaned in an oxygen plasma at 100 W for one minute. The exposed parts of the GaAs are then etched for one minute and fifteen seconds in a mixture of three parts phosphoric acid ($H_3PO_4$) to one part hydrogen peroxide ($H_2O_2$) to fifty parts water. The master registration level is completed by removing the photoresist with acetone and rinsing the sample with methanol and de-ionized water.

The sample is again covered with a photoresist, exposed through a hole etch mask, and developed. The printed and patterned resist is used as a mask during the preferred ion-milling, or in the alternative etching, of holes 20 into the substrate 21 to a depth typically of 5 microns as depicted in FIG. 2, Step 1. The photoresist is removed with acetone and the sample rinsed with methanol and de-ionized water.

Figure 2:
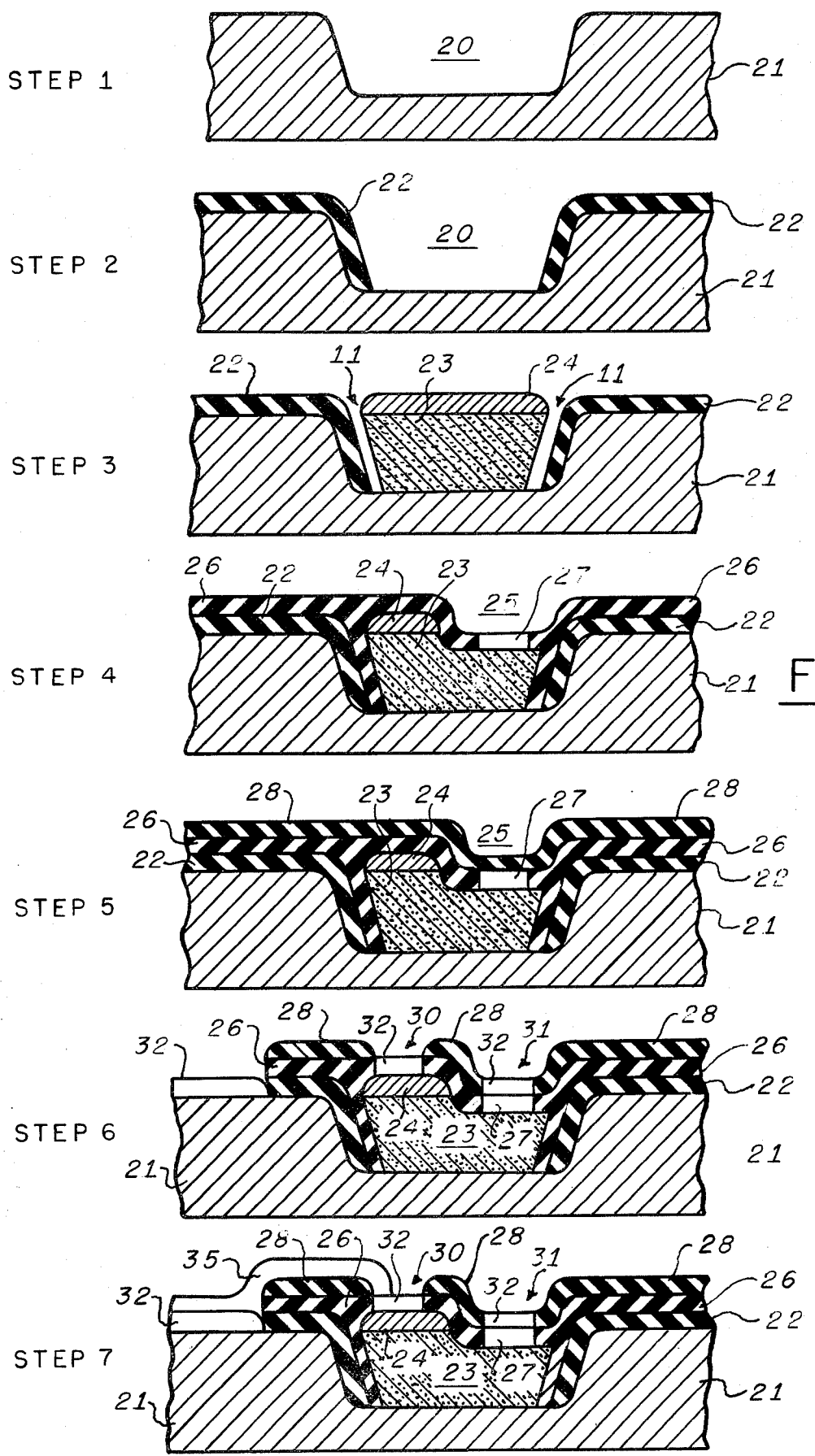
FIG. 2 shows the fabrication of a mixer diode. (The drawings while illustrative of the method are not intended to be to scale.)

FIG. 2, Step 2, consists of the chemical vapor deposition (CVD) of a dielectric layer 22, typically 1000 Å thick, which may be silicon nitride or silicon dioxide. A layer of photoresist is printed and patterned over the dielectric such that the dielectric may be etched to expose the substrate 21 in the bottom of holes 20 in the following manner: An adhesion promoter hexamethyldisilazane (HDMS) is spun on the sample at 3000 rpm for thirty seconds. A layer of photoresist, for example, AZ1375 is then spun at 3000 rpm for thirty seconds and baked at 90° C. for twenty minutes. Development for two minutes in AZ developer diluted 1:1 with water exposes the dielectric 22 in the bottom of holes 20. The dielectric is then plasma-etched in a carbon tetrafluoride and oxygen plasma at 100 W for two minutes. The photoresist is then removed with acetone and the sample rinsed with methanol and de-ionized water.

Epitaxial growth in the bottom of the holes proceed in a single orientation as follows: The exposed substrate 21 in the bottom of holes 20 is ion-milled at 0.3 ma/cm$^2$ for sixty seconds to clean the surface. Sequential epitaxial deposition of the n+ heavily doped contact layer 23 ($2\times10^{18}$ donors/cm$^3$, 5.0 microns thick) followed by the active n-layer 24 ($6\times10^{16}$ to $2\times10^{17}$ donors/cm$^3$, 0.15 microns thick) on undoped semi-insulating GaAs substrate 20 is carried out using an AsCl$_3$, Ga, H$_2$ vapor phase epitaxial reactor. Edge overgrowth, and poor surface morphology, a common problem in selective epitaxial growth, is prevented by the edges of the etched holes being covered with silicon nitride or silicon dioxide.

In FIG. 2, Step 4, the anode region is defined by a shallow mesa etch 25 through the n-type layer followed by a layer of chemical vapor deposited silicon nitride 26. The silicon nitride layer 26 is etched as before to expose the n+ layer followed by deposition, lift-off, and alloy of metal 27 for ohmic contact formation. The shallow mesa 25 is formed by etching approximately 0.1 microns deep beyond the n/n+ interface 26. For this step, the sample is covered with a photoresist, printed and developed. A 3:1:50 mixture of phosphoric acid, hydrogen peroxide, and de-ionized water is used to etch the GaAs substrate. This etchant solution removes GaAs at a rate of about 0.1 microns per minute. After etching, the photoresist is stripped in acetone. Since the n-type layer 24 is approximately 0.1 to 0.2 microns thick, and the etching proceeds 0.1 microns into the n+ layer 23, the shallow mesa level obtained is of the order of 0.2 to 0.3 microns. Sequential layers of nickel, gold, germanium, and gold in respective thicknesses of 50 Å, 650 Å, 60 Å, and 200 Å, are evaporated on the shallow mesa level 27. The Ni/Au/Ge/Au metal 27 is heated to about 470° C. for about five minutes to convert the interface to an ohmic contact. After cooling to room temperature, the ohmic contacts are checked electrically to ensure that the contacts are true ohmic contacts, rather than rectifying contacts.

In FIG. 2, Step 5, a layer 28 of silicon nitride or, alternatively, silicon dioxide, is deposited by plasma enhanced chemical vapor deposition. Any remaining space between the sidewall of hole 11 to the epitaxially grown contact layer 23 is filled by layer 28.

In FIG. 2, Step 6, the Schottky (anode) level is printed and developed. The silicon nitride layers 22, 26 and 28 are selectively plasma-etched in a gaseous mixture of carbon tetrafluoride and oxygen in the ratio of 390:10 at a power level of 150 W for 3.2 minutes. The etching process exposes windows 29, 30, and 31. The sample is then dipped in buffered hydrofluoric acid for fifteen seconds, followed by evaporation of sequential deposits of titanium, paladium, and gold in thicknesses that typically may be 200 Å, 200 Å, and 4600 Å, respectively. An acetone wash is used to remove the remaining photoresist and with it unwanted metallization, thereby leaving the desired metal pattern 32 in FIG. 2, Step 6.

In FIG. 2, Step 7, a second metal level 35 is printed, followed by a titanium and gold evaporation and lift-off. To prepare for deposition of the second level metal layer 35, the adhesion promoter HMDS is spun on the wafer at 3000 rpm, followed by a layer of photoresist spun on at 3000 rpm and baked at 90° C. for twenty minutes. The second level metal mask level is then exposed. The sample is soaked in chlorobenzene for fifteen minutes, followed by a thirty minute air dry. The pattern is developed in a mixture of 1:1 developer and ionized water for four minutes and subjected to an oxygen plasma etch for one minute at a power of 300 W and 300 microns pressure. Next, the wafer is dipped in buffered hydrofluoric acid for fifteen seconds. The second level metal layers of titanium and gold are sequentially deposited to a thickness of 200 Å and 4800 Å, respectively. The photoresist mask and unwanted metal are then removed in acetone. A final electrical test is preferably then made to establish the component DC performance and pertinent dynamic parameters, following which individual devices may be cut from the wafer.

While the invention has been described in its preferred embodiment, it is to be understood that the words which have been used are words of description rather rather than words of limitations and that changes within the purview of the appended claims may be made without departing from the true scope and spirit of the invention in its broader aspects.

What is claimed is:

1. A method for fabricating semiconductor devices on semi-insulating substrates, comprising:
   selectively removing a portion of said semi-insulating substrates creating thereby wells in said substrate,
   disposing a first dielectric layer over said semi-insulating substrate and said wells, removing selected areas of said first dielectric thereby exposing areas of said substrate underlying said wells, said exposed areas of said substrate having a single crystallographic orientation, disposing a heavily doped contact layer upon said exposed areas of said substrate having a single crystallographic orientation, disposing a moderately doped active layer on said contact layer, selectively removing a first region of said active layer and a portion of said contact layer underlying said first region, disposing a second dielectric layer over said active layer and said contact layer underlying said first region, selectively removing an area of said second dielectric in said first region exposing thereby said contact layer, metallizing said contact layer underlying said first region to form an ohmic contact, disposing a third dielectric layer over said second dielectric layer and said metallized ohmic contact, selectively removing said first, second, and third dielectric layers overlying said moderately doped layer, selectively removing said second and third dielectric layers overlying said moderately doped layer, selectively removing said third dielectric layer overlying said metallized ohmic contact, metallizing a selected region of said substrate underlying said removed first, second and third dielectric layers, metallizing a selected region of said moderately doped layer underlying said removed second and third dielectric layers, metallizing a selected region of said ohmic contact underlying said removed third dielectric layer, and selectively disposing a second metallized region overlying said selectively metallized moderately doped layer and said selectively metallized substrate.

2. The method in accordance with claim 1, in which said semi-insulating substrate comprises a compound selected from the Group III-V elements of the Periodic Table having a crystallographic structure similar to gallium arsenide.

3. The method in accordance with claim 2, in which said compound is selected from the group consisting of gallium arsenide, indium antimonide, indium phosphide, gallium aluminum arsenide, gallium aluminum indium arsenide, indium arsenide, gallium phosphide, and gallium aluminum indium phosphide.

4. The method in accordance with claim 3, in which said compound is comprised of gallium arsenide material.

5. The method in accordance with claim 4, in which the step of disposing a contact layer of said substrate comprises vapor phase deposition of doped gallium arsenide material on said semi-insulating substrate.

6. The method in accordance with claim 5, in which the step of disposing an active layer on said contact layer comprises a further vapor phase deposition of doped gallium arsenide on said contact layer.

7. The method in accordance with claim 1, wherein said dielectric layer is selected from the group consisting of silicon nitride and silicon dioxide.

8. The method in accordance with claim 7, in which said dielectric is deposited by the process of plasma enhanced chemical vapor deposition.

9. The method in accordance with claim 5, in which said contact layer is heavily doped with n-type material.

10. The method in accordance with claim 6, in which said active layer in moderatly doped with n-type material.

11. The method in accordance with claim 1, wherein said first region of said contact layer is metallized with sequential layers of nickel, gold, germanium, and gold.

12. The method in accordance with claim 1, wherein said metallization of said substrate, said moderately doped layer and said ohmic contact consists of a composite of sequential layers of titanium, palladium, and gold.

13. The method in accordance with claim 1, wherein said second metallized region comprises a metallizing overlay comprised of a composite consisting of sequential layers of titanium and gold.

14. The method in accordance with claim 1, wherein said wells are at least 4 microns in depth.

15. The method in accordance with claim 1, in which said single crystallographic orientation of said heavily doped contact layer is achieved by preventing unwanted and random deposition of said heavily doped layer on sides of said well by covering sides of said well with said first dielectric layer.

* * * * *